United States Patent [19]
Thomann et al.

[11] Patent Number: 5,964,896
[45] Date of Patent: Oct. 12, 1999

[54] METHOD AND APPARATUS FOR A HIGH SPEED CYCLICAL REDUNDANCY CHECK SYSTEM

[75] Inventors: Mark Thomann; Huy Thanh Vo, both of Boise; Charles L. Ingalls, Meridian, all of Id.

[73] Assignee: Micron Technology, Inc., Boise, Id.

[21] Appl. No.: 08/839,873

[22] Filed: Apr. 17, 1997

Related U.S. Application Data

[62] Division of application No. 08/474,397, Jun. 7, 1995, Pat. No. 5,854,800.

[51] Int. Cl.⁶ .................................................. H03M 13/00
[52] U.S. Cl. ............................................ 714/781; 714/757
[58] Field of Search .................................. 371/37.7, 37.6, 371/40.11; 714/781, 757

[56] References Cited

U.S. PATENT DOCUMENTS

| | | | |
|---|---|---|---|
| 5,241,546 | 8/1993 | Peterson et al. | 371/38.1 |
| 5,553,067 | 9/1996 | Walker et al. | 370/390 |
| 5,602,828 | 2/1997 | Engdahl et al. | 371/20.1 |
| 5,602,857 | 2/1997 | Zook et al. | 371/40.14 |

FOREIGN PATENT DOCUMENTS

| | | |
|---|---|---|
| 0226353 | 6/1987 | European Pat. Off. . |
| 3841370 | 6/1989 | Germany . |
| A55-120252 | 9/1980 | Japan . |
| A57-076621 | 5/1982 | Japan . |
| A58-206254 | 1/1983 | Japan . |
| WO90/10265 | 9/1990 | WIPO . |

OTHER PUBLICATIONS

"High Speed Parallel cyclic Redundancy Check Generator", *IBM Technical Disclosure Bulletin*, vol. 33, No. 5, pp. 51–56, (Oct. 1990).

"Parallel Checksum Calculation Accelerator", *IBM Technical Disclosure Bulletin*, vol. 36, No. 12, pp. 647–648, (Dec. 1993).

Johnson, B.W., "Design and Analysis of Fault–Tolerant Digital Systems", *Addison–Wesley Series in Electrical and Computer Engineering*, pp. 102–113, (1957).

*Primary Examiner*—Albert De Cady
*Assistant Examiner*—Shelly A Chase
*Attorney, Agent, or Firm*—Schwegman, Lundberg, Woessner & Kluth P.A.

[57] ABSTRACT

A high speed cyclical redundancy check system for use in digital systems. The high speed cyclical redundancy check system providing programmable error correction functions for different data protocols. The high speed cyclical redundancy check system providing programmable data paths for minimizing overhead and maximizing throughput. The system supporting multiple operations in a single cycle.

14 Claims, 11 Drawing Sheets

METHOD AND APPARATUS FOR A HIGH SPEED CYCLICAL REDUNDANCY CHECK SYSTEM

This application is a division of U.S. patent application Ser. No. 08/474,397, filed Jun. 7, 1995, now U.S. Pat. No. 5,854,800.

FIELD OF THE INVENTION

The present invention relates to digital cyclical redundancy check systems and, in particular, to a high speed cyclical redundancy check system for digital systems.

BACKGROUND OF THE INVENTION

Digital systems often employ a cyclical redundancy check ("CRC") of data transferred by the system for error detection and correction of digital data. Present digital systems have error correction systems which generally require a fixed data transfer protocol to implement error detection and correction.

For example, in computer systems, data is transferred according to a predetermined protocol and a CRC is performed on each byte transferred. Raw data is passed through a CRC module which provides CRC bit information associated with each byte of raw data. This CRC bit information may be concatenated with the raw data and transferred with the raw data. The raw data and CRC bit information are then received. The CRC bit information is stored in a buffer and an error detection module performs another CRC on the raw data. If the newly generated CRC bit information matches the CRC bit information stored in the buffer, then the receiver has correctly received each bit of the raw data and there is no error correction necessary. If the CRC bit information does not match, then an error has been detected and the receiver can perform error correction accordingly.

For systems with small throughput, such error correction may be performed regularly on a fixed protocol, since the processing overhead of performing such correction is minimal. However, for systems with large data volumes, the overhead of a fixed and inflexible error correction system may greatly impair throughput.

Additionally, some forms of digital data do not require error correction, since the information is required to be processed in real time and the loss of some of the raw data is not particularly detrimental to the operation of the system. One example is digitized speech applications. In this case, error correction is unnecessary overhead which diminishes throughput.

Therefore, there is a need in the art for a high speed error correction system. The error correction system should also be programmable, so that raw data passing through the system may optionally be checked or not checked as the situation demands. Such a system should be flexible to handle differing data protocols without having to perform hardware modifications.

SUMMARY OF THE INVENTION

The present disclosure describes a system for cyclical redundancy checking of data in a digital computer system. The present system provides high speed error correction through the use of a programmable architecture. The system includes an input buffer, a latch, a CRC generator and write circuit, a status register, and an edit buffer which are connected on a common bus structure to provide maximum flexibility in performing error correction.

The data flow may be programmed to bypass the CRC module if the data does not require error correction. Additionally, the raw data may be processed to accomodate different data protocols, so that the system is not restricted to a single data protocol.

BRIEF DESCRIPTION OF THE DRAWINGS

In the drawings, where like numerals describe like components throughout the several views.

DETAILED DESCRIPTION OF THE PREFERRED EMBODIMENT

In the following detailed description of the preferred embodiment, references are made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that structural changes may be made without departing from the spirit and scope of the present inventions. The following detailed description is, therefore, not to be taken in a limiting sense, and the scope of the present inventions is defined by the appended claims and equivalents thereof.

Figure 1:
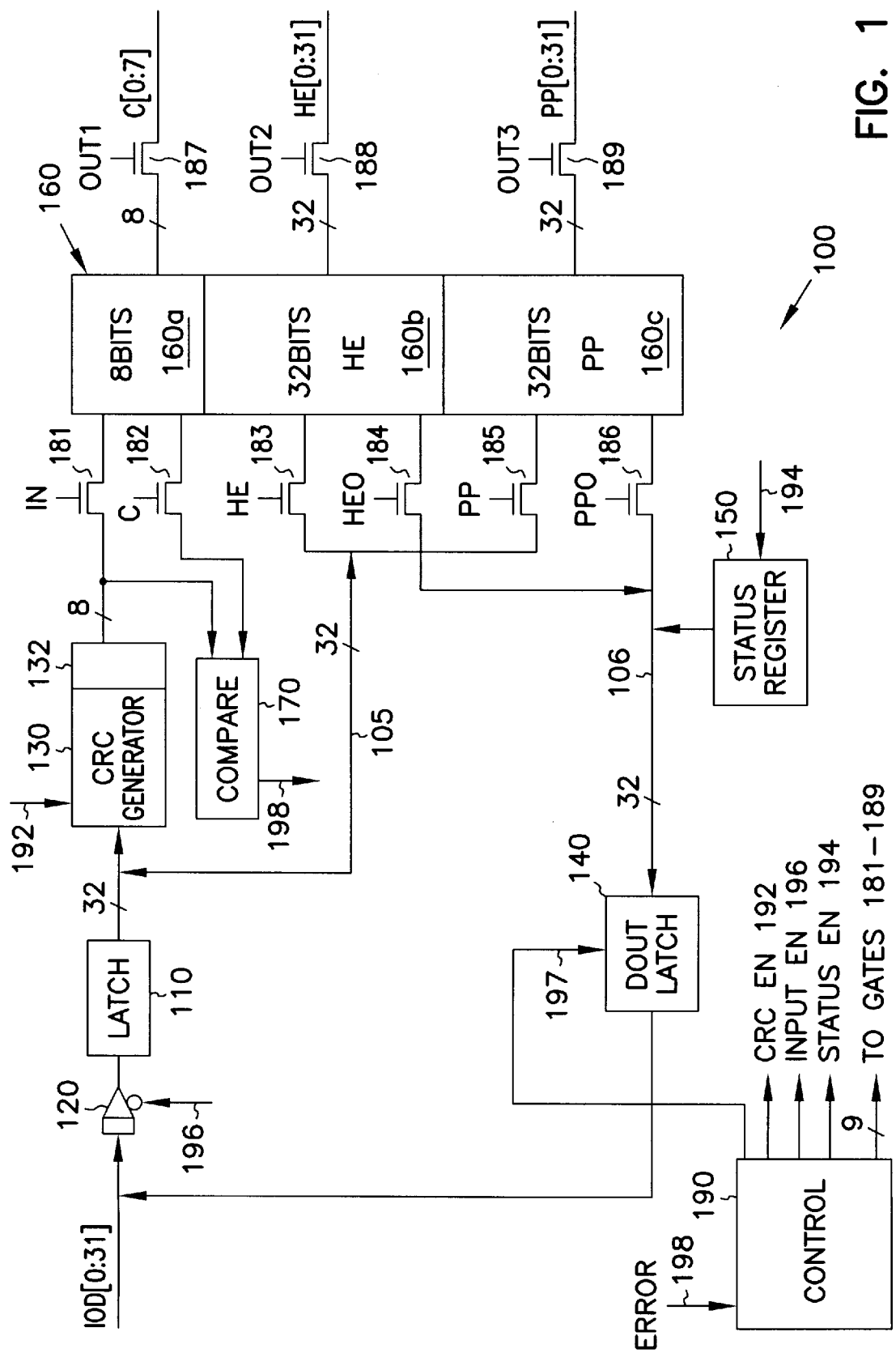
FIG. 1 is a block diagram of one embodiment of a cyclical redundancy check system.

FIG. 1 shows a general block diagram of one embodiment of the cyclical redundancy check (CRC) system. The data flow through the system is bidirectional. Data inputs into port IOD[0:31] on the left hand side of FIG. 1 can transfer to ports HE[0:31], PP[0:31], and CRC Generator 130. Data from ports HE[0:31] and PP[0:31] can transfer to CRC Generator 130 via data bus 105 using gates 183 and 185, or data bus 106 using gates 184 and 186 for transfer to port IOD[0:31] for output. Additionally, inputs into port IOD [0:31] may also be processed by the CRC system 100 and return to port IOD[0:31] for output. Similarly, inputs to ports HE[0:31] and PP[0:31] may be processed internally in CRC system 100 and returned to ports HE[0:31] and PP[0:31]. Therefore, the architecture of CRC system 100 is programmable and flexible to handle different protocols and data processing operations.

Data flow control through CRC system 100 is performed via control 190 by using inputs through gates 181–189, CRC enable 192, input enable 196, Dout Latch Enable 197, and status enable 194. Control 190 also receives error signal 198 for processing error correction information provided by CRC generator 130, edit buffer 160, and compare 170.

Modes of Operation

The improved architecture of the present invention provides flexibility in data flow and data processing which can be demonstrated by a number of processing modes. In a first mode of operation, CRC system 100 receives parallel data from ports C[0:7], HE[0:31], and PP[0:31] by enabling gates 187, 188, and 189, respectively. Data from these ports is entered into edit buffer 160 and stored there for further processing. The raw data stored in edit buffer 160 may be transferred using a number of different protocols, however, a frequently encountered protocol includes 8 bits of CRC information stored in register 160a of edit buffer 160, 32 bits of header information stored in register 160b, and 32 bits of raw data stored in register 160c. Another protocol includes 8 bits of CRC information stored in register 160a of edit buffer 160, 32 bits of header information stored in register 160b, and 32 bits of prepend and postpend data stored in register 160c. FIG. 1 illustrates register 160a as 8 bits wide, 160b as 32 bits wide, and 160c as 32 bits wide, however, those skilled in the art will readily recognize that different register bit lengths may be employed without departing form the scope and spirit of the present invention. The use of these register lengths is not intended in an exclusive or limiting fashion.

In this first mode of operation, CRC system 100 is used to receive data from ports C[0:7], HE[0:31], and PP[0:31] and verify that the data received is error free. Data is stored in edit buffer 160 by strobing gates 187, 188, and 189. The gates shown in FIG. 1 represent parallel transmission gates of 8, 32 and 32 bits, respectively. Data from either register 160b or register 160c may be transferred to CRC generator 130 over data bus 105 using gates 183 and 185. CRC generator 130 must be enabled by control 190 via CRC enable 192 to generate a new 8 bit CRC word based on the 32 bits presented to the input of CRC generator 130. CRC write circuit 132 latches the newly generated CRC word, which is then available to compare 170. The contents of register 160a are also provided to compare 170 upon strobing gate 182, and compare 170 generates error signal 198. Compare 170 generates a logic one if there is a difference in the CRC words from CRC generator 130 and register 160a. The protocol determines whether CRC checking is performed on the contents of register 160b or 160c, however, in this embodiment, the preference is to perform error correction on the contents of register 160b. The present CRC system 100 can generate CRC information for either data stored in register 160b or 160c, adding to the number of modes which may be processed by the present system.

In a second mode of operation, the present CRC system takes raw data from port IOD[0:31] and formats the data for transmission by (1) generating the appropriate CRC word for the raw data and transferring the CRC word to port C[0:7], and (2) transferring the raw data to port HE[0:31] or PP[0:31], depending on the protocol. In this second mode, the present CRC system 100 receives a 32 bit word into port IOD[0:31] and stores the word in latch 110 when input buffer 120 is activated with an input enable 196 from control 190. The protocol used determines which 32 bit port of edit buffer 160 receives the stored word (raw data). For example, in one operation, the stored word in latch 110 is sent to register 160b via data bus 105 by enabling gate 183. In another example, the stored word is sent to register 160c via data bus 105 an by enabling gate 185. If error correction is desired on the word in latch 110, the word is processed by asserting a CRC enable 192 of CRC generator 130 for CRC word generation. The CRC word generated can be stored in register 160a by enabling gate 181.

A variation of this second mode of operation allows 64 bits of data to be processed by repeated strobes of 32 bit words. The first and second 32 words of the 64 bits are stored in edit buffer 160 by repeated latches of data from port IOD [0:31] into latch 110 and to registers 160b and 160c using data bus 105 and gates 183 and 185. In this case, however, CRC word generation must occur on only 32 bits of the 64 bit data. However, the flexibility of the present CRC system 100 allows the CRC to be programmed on either the 32 bit word stored in register 160b or register 160c.

In a third mode of operation CRC system 100 provides a "pipeline" flow between IOD[0:31] and HE[0:31] or PP[0:31]. Data flow is bidirectional, and may proceed from HE[0:31] and PP[0:31] to IOD[0:31]. Data from IOD[0:31] is transferred to HE[0:31] and PP[0:31] via input buffer 120, latch 110, data bus 105, and gates 183 and 185. Data from HE[0:31] and PP[0:31] is transferred to IOD[0:31] using data bus 106, Dout latch 140, and gates 184 and 186. Data can be pipelined in three different formats:

format 1 provides 32 bit transfer between IOD[0:31] and HE[0:31];

format 2 provides 32 bit transfer between IOD[0:31] and PP[0:31]; and format 3 provides 64 bit transfer by successive 32 bit transfers between IOD[0:31] and both HE[0:31] and PP[0:31].

Note also that each of the above formats is doubled since each format may or may not require CRC on the data transferred. However, in the 64 bit format, CRC information can only be generated for 32 bits of the 64 bit word.

In yet another mode of operation, CRC system 100 provides 32 bit word transfer and CRC in a single cycle to maximize speed of data transfer. For example, assume edit buffer 160 contains a CRC word in register 160a, a header word in 160b, and raw data in 160c. In a single cycle (1) the raw data is transferred to Dout latch 140 via data bus 106 and gate 186, (2) the header word is CRC error checked using data bus 105 and gate 183, and (3) compare 170 enabled and checks the CRC Generator 130 8 bit output against the 8 bit data in register 160a. Anytime an "output" operation is performed, the Dout-latch-enable 197 will activate Dout latch 140 and data will be presented to IOD[0:31].

The flexibility and programmability of the present CRC system 100 also provides a mode whereby the CRC can be performed on the contents of register 160c instead of 160b. In this mode, data bus 106 and gate 184 are used to transfer the contents of register 160b to Dout latch 140. Data bus 105 and gate 185 are used to transfer the contents of register 160c to CRC generator 130 for CRC word generation. CRC system 100 has a flexible architecture which provides other permutations of data transfer than those mentioned, and the modes demonstrated were not intended in an exclusive or limiting sense.

CRC system 100 allows a user to put data into the PP 160c or HE 160b registers and/or register 160a and at the same time read data from the status register 150 and present data onto bus 106 and into Dout latch 140 and out to IOD [0:31]. In alternate embodiments, status register 150 comprises separate subregisters, similar to edit buffer 160, and multiplexers to selectively connect each subregister to data bus 106.

Figure 7:
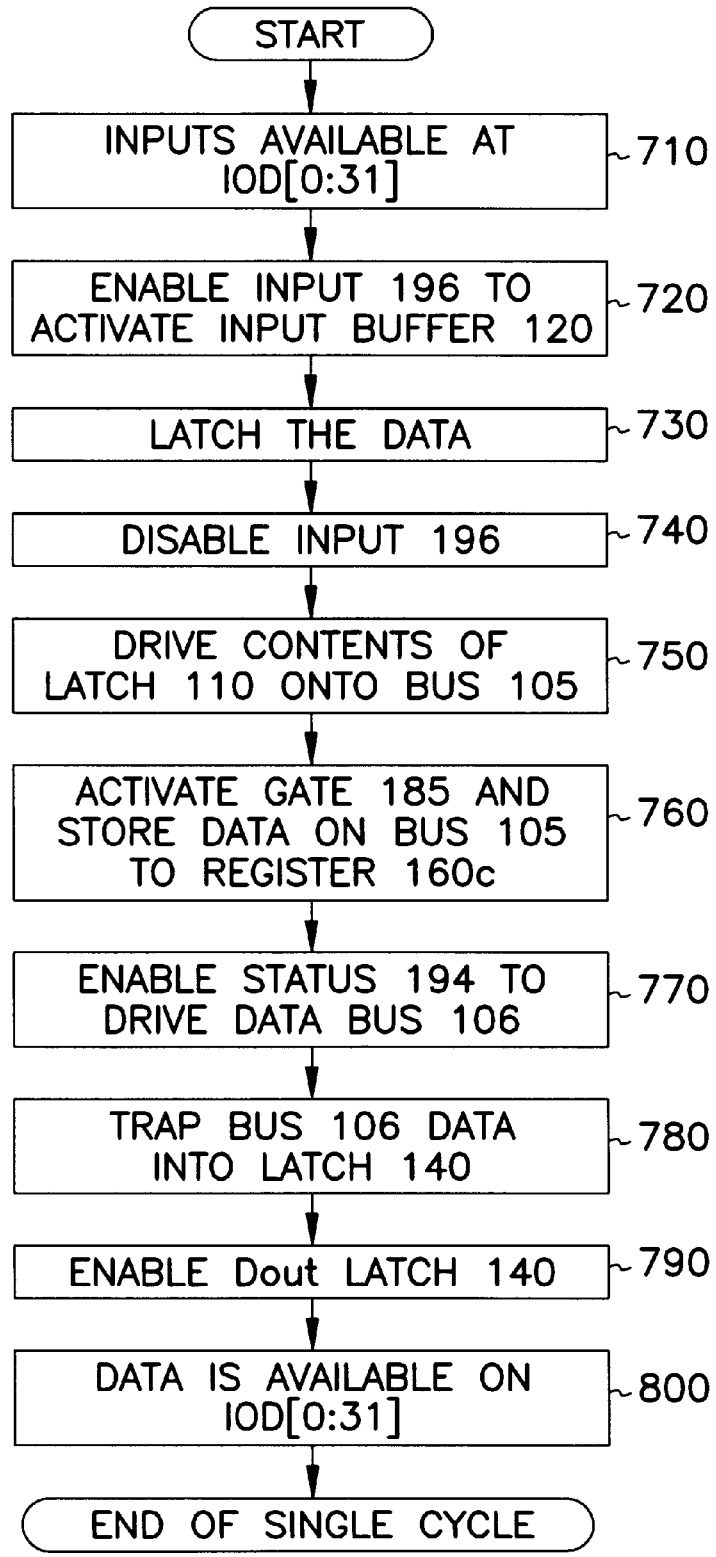
FIG. 7 is a flow diagram showing one example of a single cycle operation of the cyclical redundancy check system of FIG. 1.

One example of a single cycle operation is shown in FIG. 7. In a single cycle, CRC system 100 takes data inputs on IOD[0:31] and latches them into latch 110 (steps 710, 720, and 730). The input buffer is disabled to prevent further data transitions from being transmitted to latch 110 from input buffer 120 (step 740). The data in latch 110 is driven onto data bus 105 (step 750). At this point the data is available for either register 160b or 160c via data bus 105 and gates 183 and 185, respectively (step 760). Other operations are performed in the same cycle, for instance, the contents of status register 150 may be transferred to IOD[0:31] using Dout latch 140 (steps 770, 780, 790, and 800). Other operations are possible without departing from the scope and spirit of the present invention. Coordination of the enable signals is performed by control 190. One embodiment of control 190 uses combinational logic and analog timing delays to synchronize the timing of the enables used in the single cycle operation. Another embodiment uses a processor and digital timer to perform the control. Other methods of control are possible without departing from the scope and spirit of the present invention.

Detailed Logic Diagrams

Figure 2A:
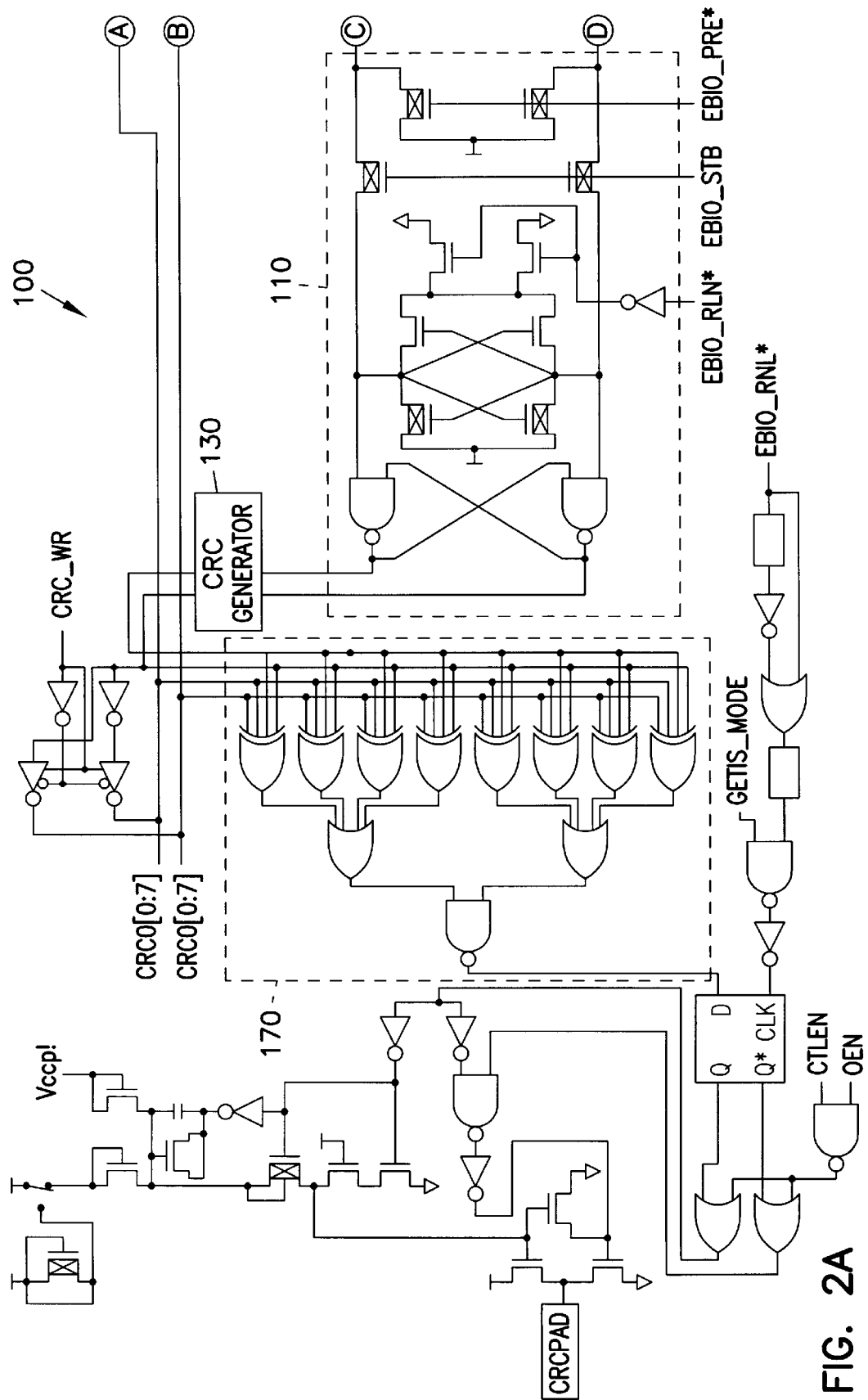
FIG. 2A and FIG. 2B and FIG. 2C are a detailed schematic of the cyclical redundancy check system of FIG. 1.
Figure 2B:
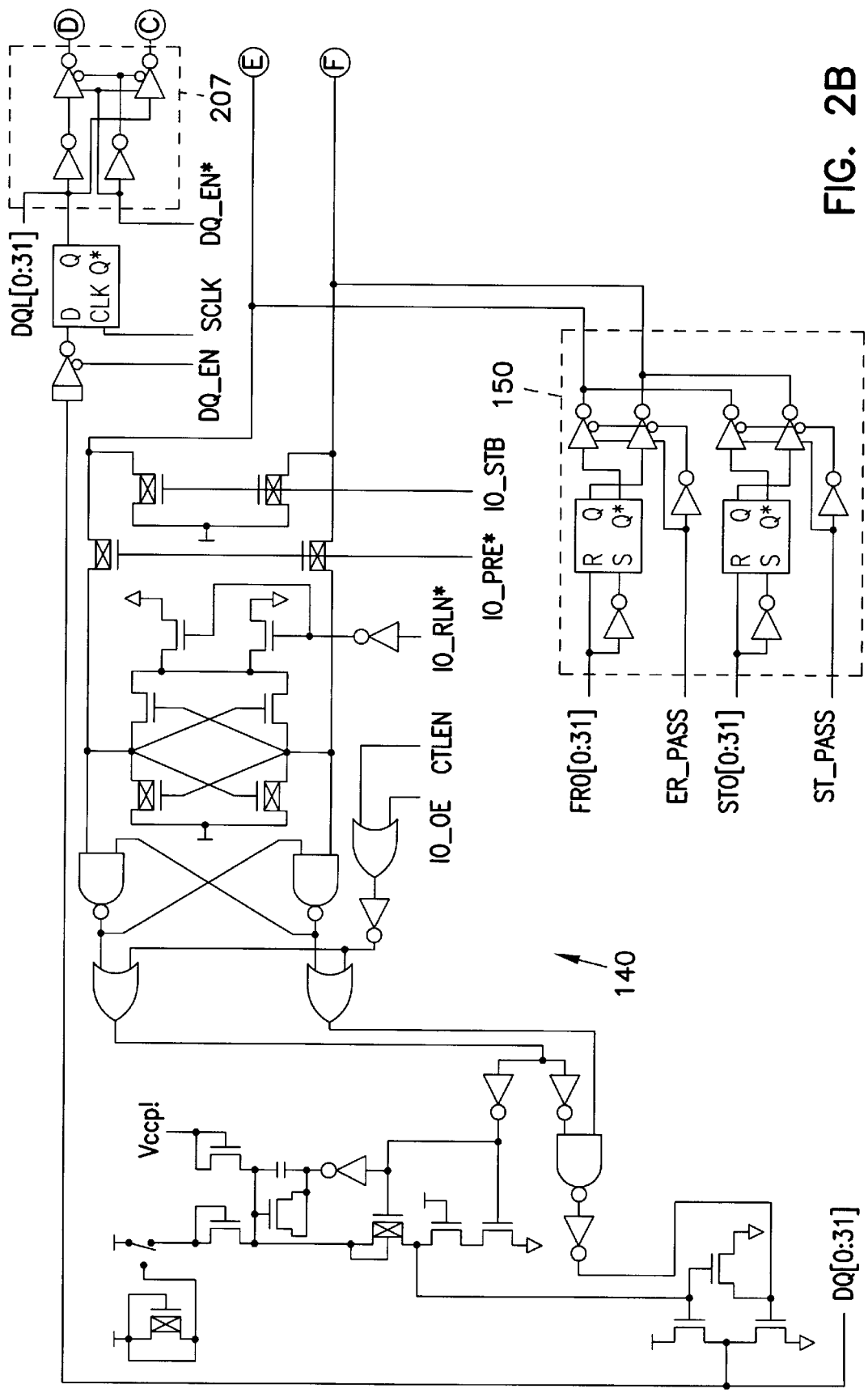
Figure 2C:
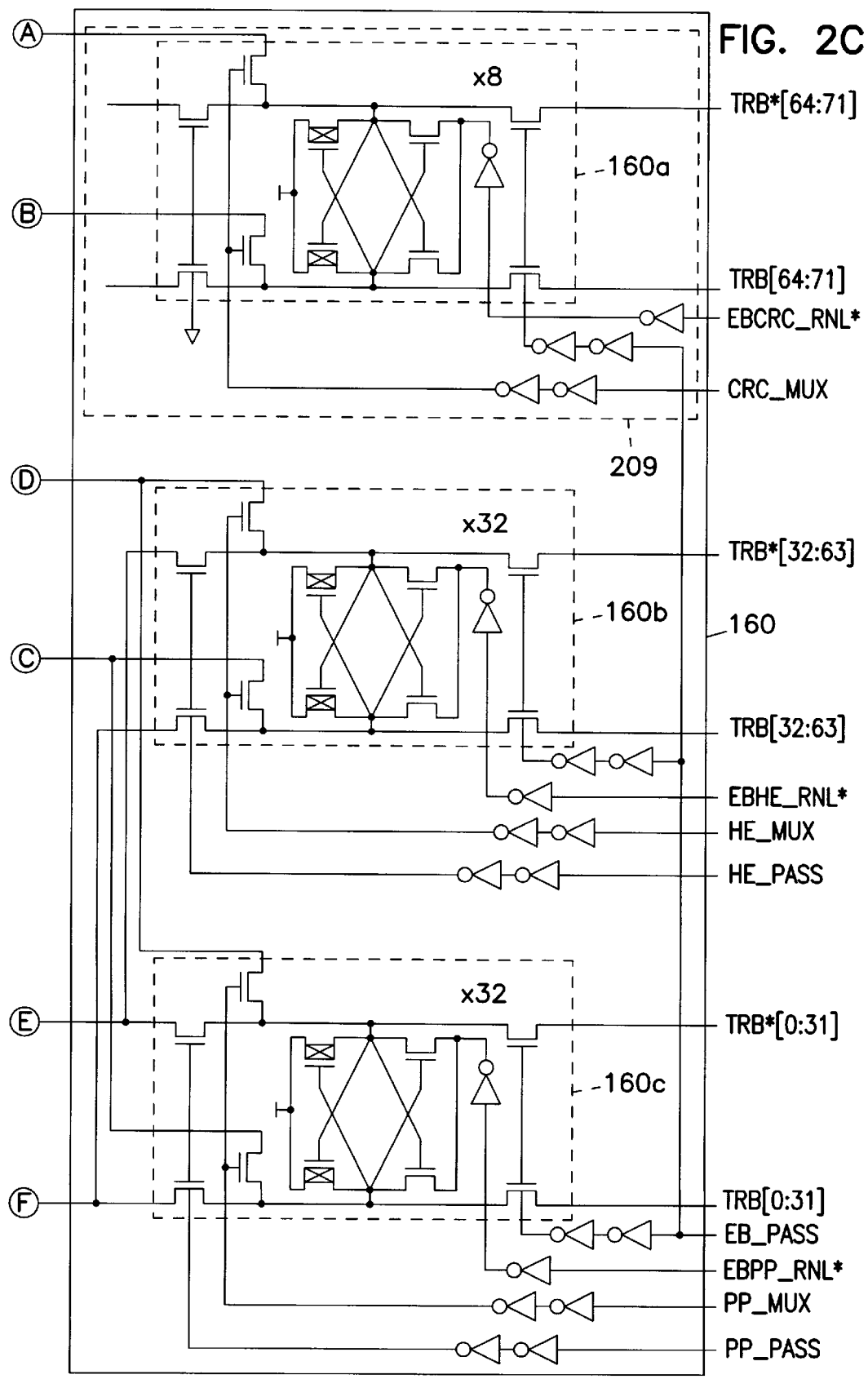
Figure 3A:
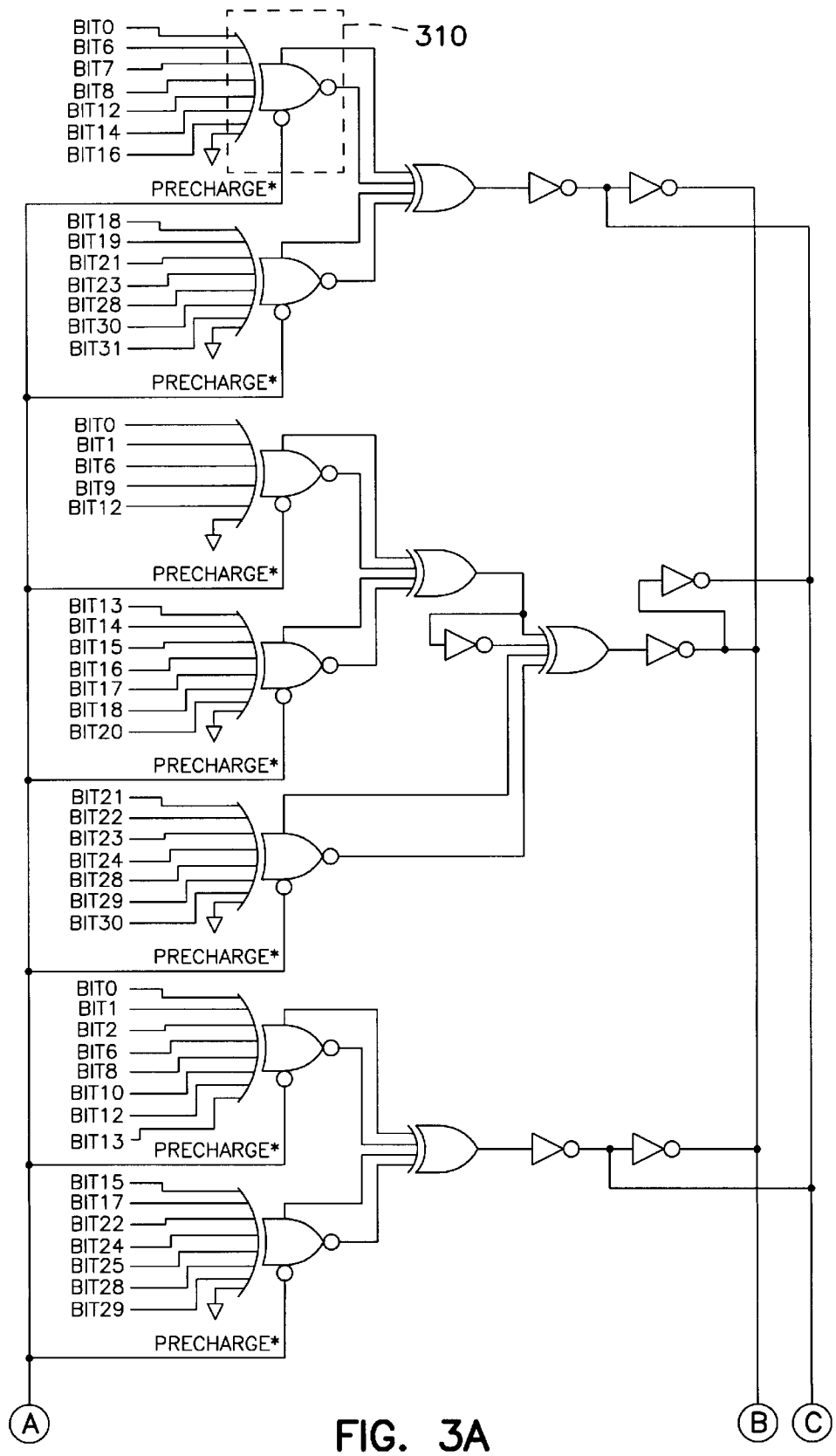
FIGS. 3A, 3B and 3C are a detailed schematic of one example of a CRC generator module for the cyclical redundancy check system of FIG. 1.
Figure 3B:
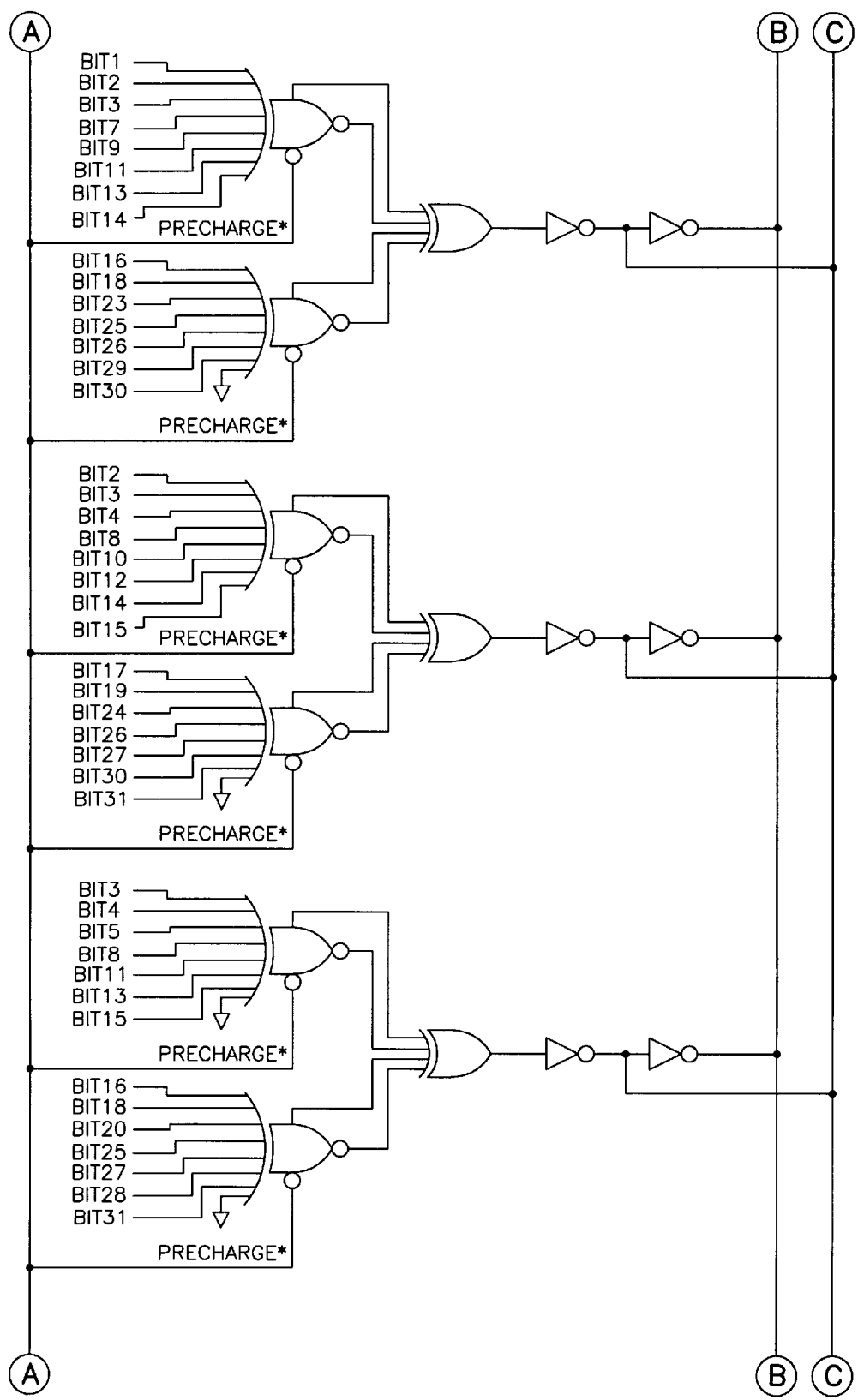
Figure 3C:
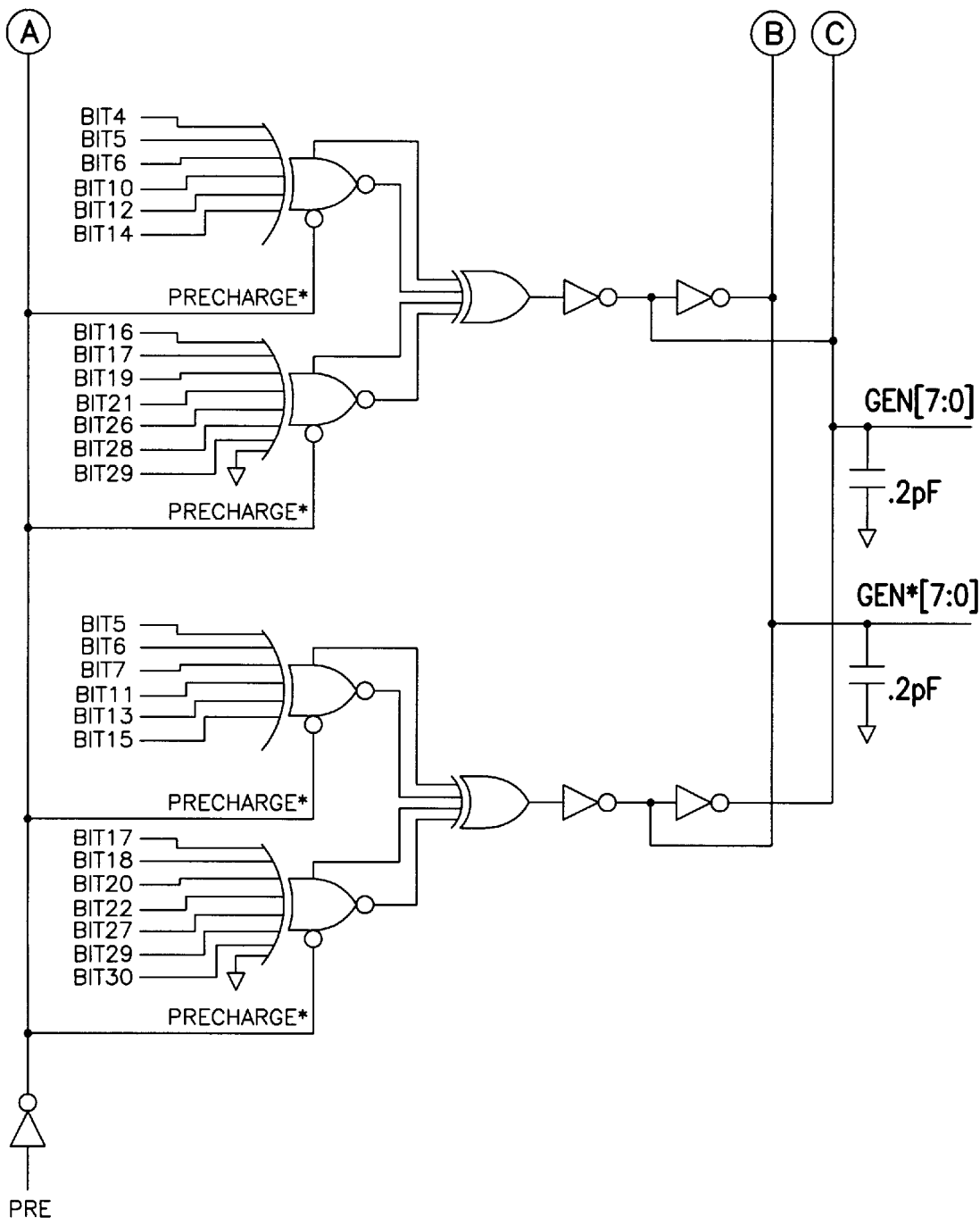
Figure 4:
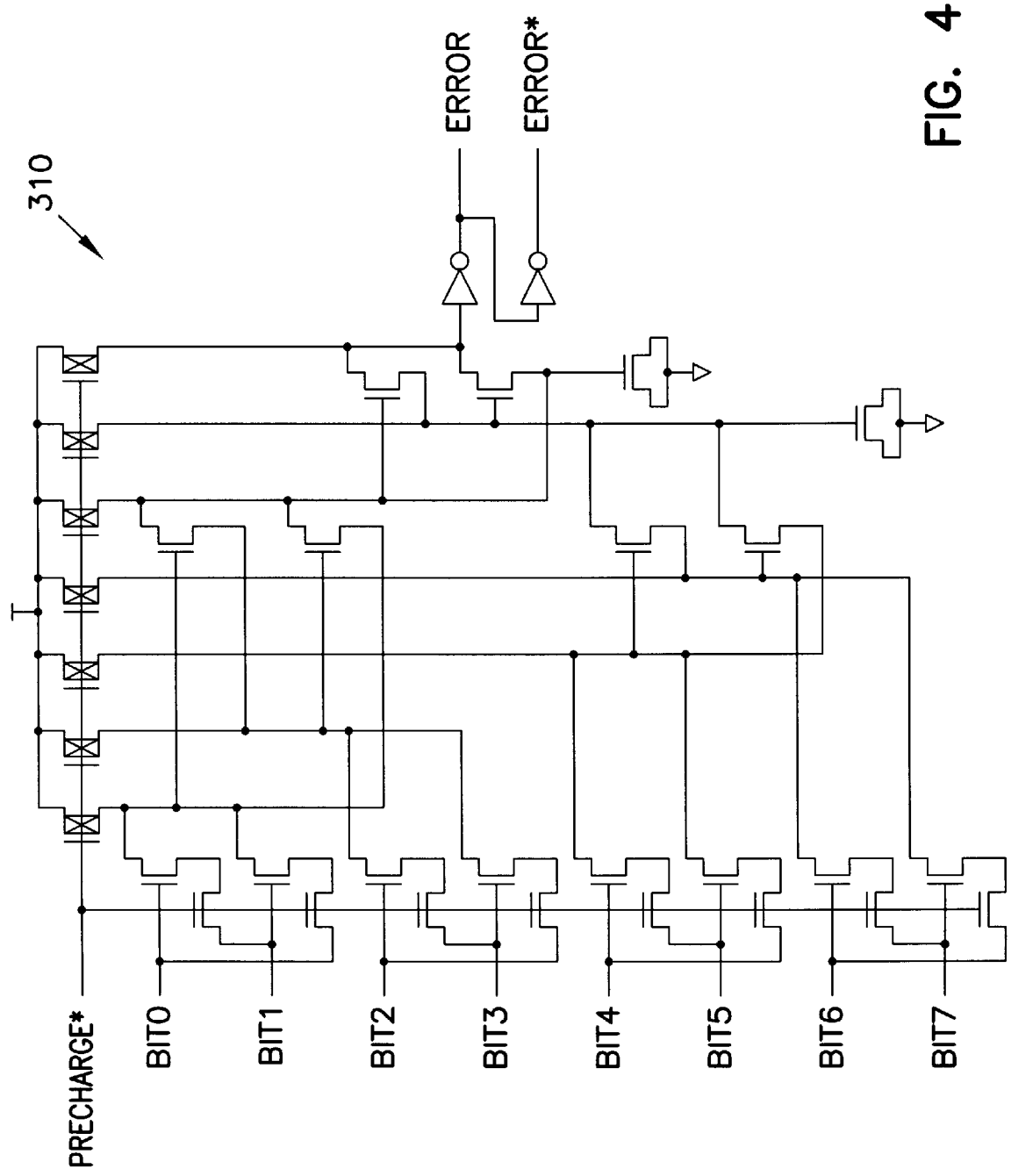
FIG. 4 is a detailed schematic of one stage of the CRC generator module of FIG. 3.
Figure 5:
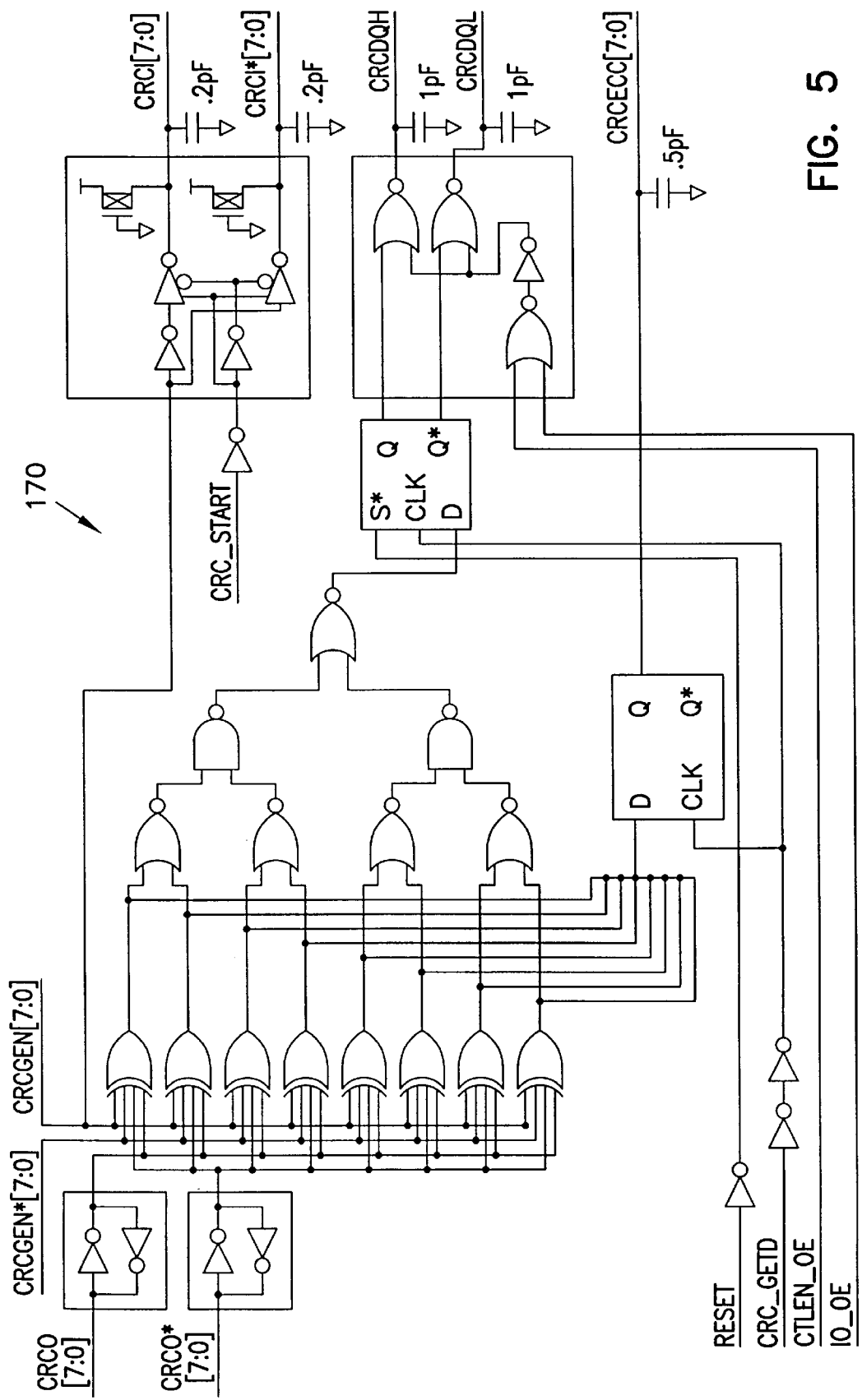
FIG. 5 is a detailed schematic of one example of a compare circuit for the cyclical redundancy check system of FIG. 1.
Figure 6:
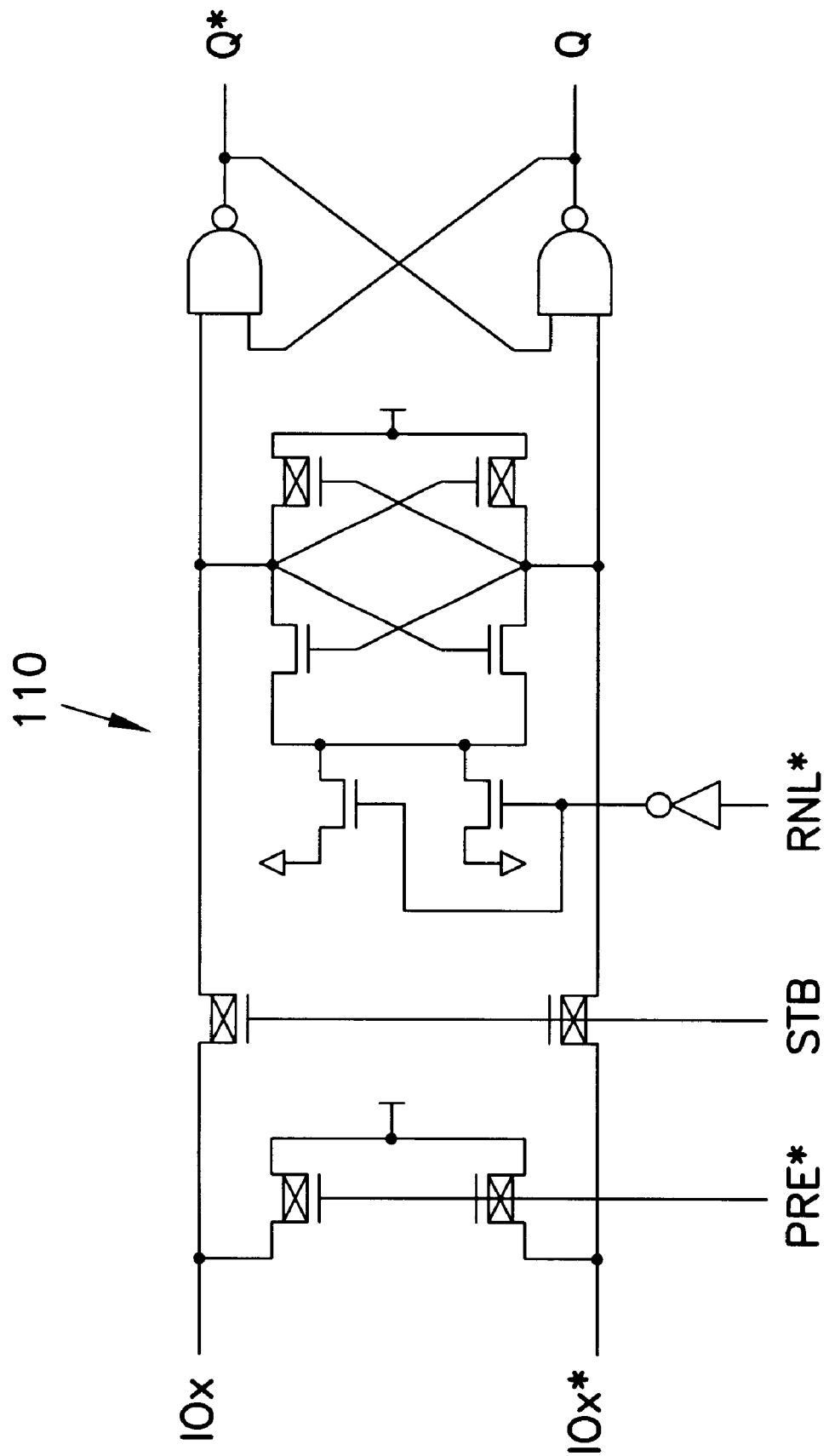
FIG. 6 is a detailed schematic of one example of a latch circuit for the cyclical redundancy check system of FIG. 1.

FIG. 2A and FIG. 2B and FIG. 2C are a detailed schematic of the CRC system of FIG. 1, showing detailed logic diagrams for compare 170, latch 110, CRC driver 132, status register 150, Dout latch 140, and edit buffer 160. FIGS. 3A, 3B and 3C are a detailed logic diagram of CRC generator 130. An exemplary stage 310 of CRC generator 130 is shown in FIG. 4. FIG. 5 is a detailed logic diagram of one embodiment of compare circuit 170. FIG. 6 is a detailed logic diagram of latch circuit 110.

High Speed CRC Operation

A high speed and compact CRC system 100 is produced from an advanced edit buffer 160 latch (EB_HFF 209 of FIG. 2C) and a tri-state inverter 7 driver circuit 207 of FIG. 2B. To generate the CRC either the data of register 160b or 160c are multiplexed onto data bus 105 (EBIO[0:31], or D and C of FIG. 2C) and strobed into CRC generator 130 using latch 110 (isosa_crc latches 110 of FIG. 2A), which is shown in more detail in FIG. 6. Each isosa_crc latch of latch 110 has precharge, isolation, strobe, and latch circuits. In the precharge time the lines of data bus 105 are precharged high, the CRC strobe 192 is low, and the edit buffer 160 is precharged. Upon a CRC strobe 192, the precharge turns off and either the write driver or the edit buffer 160 outputs are activated to allow charge to be dumped onto data bus 105. A period of time sufficient to allow a charge differential to develop passes and the data is latched into the latch 110, which allows for precharge to be activated for the next access and saves power by isolating a large capacitance of the data bus 105 lines. At this point in time data is latched and presented at the Q and Q* outputs of latch 110 and will remain valid until another access. The latch 110 Q and Q* outputs are at full CMOS value for the CRC generator 130, which uses a precharge scheme and requires stable DC inputs for proper activation. The CRC precharge is disabled to generate CRC outputs from CRC generator 130. This scheme is very fast and requires less layout space than a CMOS EXOR gate type of circuit.

Conclusion

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. For example, the number of bits per register may vary without departing from the scope and spirit of the present invention. Additionally, minor variations in the connections of the registers and buffers in the design may be performed without deviating from the present invention. Those with skill in the electrical, computer, and telecommunications arts will readily appreciate that the present invention may be implemented in a very wide variety of embodiments. For example, any digital system incorporating error correction may use the present invention to provide programmable error correction for enhanced throughput. This includes digital video, audio, computers, computer networks, and other telecommunications systems. This application is intended to cover any adaptations or variations of the preferred embodiment discussed herein. Therefore, it is manifestly intended that this invention be limited only by the claims and the equivalents thereof.

We claim:

1. A method for cyclical redundancy check error generation in a bidirectional system having a cyclical redundancy check generator, a data latch, and a programmable data buffer connected by a plurality of data bus lines, the data latch having a precharge circuit and the data buffer having data buffer outputs programmable to support a plurality of error processing modes, the method comprising the steps of:

inhibiting the cyclical redundancy check generator and the data buffer outputs;

precharging the plurality of data bus lines to a first logic level until a cyclical redundancy check strobe is detected;

turning off the precharge circuit;

activating the data buffer outputs in accordance with one of the plurality of error processing modes corresponding to data stored within the data buffer to modulate charge on the plurality of data bus lines;

waiting for a sufficient time for the plurality of data bus lines to develop a charge differential;

latching data on the plurality of data bus lines in the data latch; and performing a cyclical redundancy check on the latched data wherein data transferred from the data buffer to a first data port is checked for errors and an error check word is generated for data transferred from the first data port to the data buffer.

2. The method of claim 1, further comprising the step of isolating the data latch from the plurality of data bus lines after the data is latched in the data latch.

3. The method of claim 1, wherein the step of inhibiting the cyclical redundancy check generator comprises the step of precharging the cyclical redundancy check generator to a second logic level.

4. The method of claim 1, wherein an check word buffer is connected to the cyclical redundancy check generator and the step of performing the cyclical redundancy check comprises the steps of:

activating the cyclical redundancy check generator when the cyclical redundancy check strobe is detected;

generating an error check word from the data latched in the data latch; and comparing the error check word with data in the check word buffer.

5. A method for cyclical redundancy check error generation in a bidirectional system having a cyclical redundancy check generator, a data latch, and two programmable data buffers connected by a plurality of data bus lines, the data latch having a precharge circuit, and the data buffers having data outputs programmable to support a plurality of error processing modes, the method comprising the steps of:

inhibiting the cyclical redundancy check generator and the data outputs;

precharging the plurality of data bus lines to a first logic level until a cyclical redundancy check strobe is detected;

turning off the precharge circuit;

activating the data outputs from one of the data buffers in accordance with one of the plurality of error processing modes corresponding to data stored within the data buffer to modulate charge on the plurality of data bus lines;

waiting for a sufficient time for the plurality of data bus lines to develop a charge differential;

latching data on the plurality of data bus lines in the data latch; and performing a cyclical redundancy check on the latched data wherein data transferred from the data buffer to a first data port is checked for errors and an error check word is generated for data transferred from the first data port to the data buffer.

6. A bidirectional programmable error detection and correction system comprising:

an edit buffer programmable to support a plurality of error processing modes;

an error check module programmable for generating and comparing error check words;

a first parallel data bus programmable for transferring data from the edit buffer to a first data port;

a second parallel data bus programmable for transferring data from the first data port to the error check module and to the edit buffer, and further programmable for transferring data from the edit buffer to the error check module;

a third parallel data bus programmable for transferring an error check word between the error check module and the edit buffer;

a control module for programming the first, second and third data buses, and the error check module to operate according to the plurality of error processing modes, wherein data transferred from the edit buffer to the first data port is checked for errors and an error check work is generated for data transferred from the first data port to the edit buffer.

7. The programmable error detection and correction system of claim 6, wherein a first error processing mode causes the control module to program the second data bus to transfer data from the edit buffer to the error check module, causes the control module to program the third data bus to transfer a first error check word from the edit buffer to the error check module, and causes the error check module to generate a second error check word based on the data and to compare the first and second error check words.

8. The programmable error detection and correction system of claim 6, wherein a second error processing mode causes the control module to program the second data bus to transfer data from the first data port to the edit buffer and to the error check module, causes the control module to program the error check module to generate an error check word from the data, and causes the control module to program the third data bus to transfer the error check word to the edit buffer.

9. The programmable error detection and correction system of claim 6, wherein a third error processing mode causes the control module to program the first data bus to transfer first data from the edit buffer to the first data port, and causes the control module to program the second data bus to transfer second data from the first data port to the edit buffer.

10. The programmable error detection and correction system of claim 6, wherein the edit buffer comprises two data portions and the control module programs the first and second buses to transfer data to and from the data portions according to a plurality of data protocols.

11. The programmable error detection and correction system of claim 10, wherein a first data protocol stores a header word in one of the data portions and raw data in the other data portion.

12. The programmable error detection and correction system of claim 10, wherein a second data protocol stores header data in one of the data portions and prepend and postpend data in the other data portion.

13. The programmable error detection and correction system of claim 10, wherein a third data protocol stores raw data in both data portions.

14. The programmable error detection and correction system of claim 6, wherein the error check module generates and compares cyclical redundancy check words.

* * * * *

UNITED STATES PATENT AND TRADEMARK OFFICE
CERTIFICATE OF CORRECTION

PATENT NO. : 5,964,896 Page 1 of 1
APPLICATION NO. : 08/839873
DATED : October 12, 1999
INVENTOR(S) : Thomann et al.

It is certified that error appears in the above-identified patent and that said Letters Patent is hereby corrected as shown below:

In column 8, line 45, insert --15. The programmable error detection and correction sytem of claim 6, wherein the control module programs a fourth parallel data bus to transfer data between a second data port and the edit buffer.--

Signed and Sealed this

Nineteenth Day of February, 2008

JON W. DUDAS
*Director of the United States Patent and Trademark Office*